United States Patent [19]
Itoh

[11] Patent Number: 5,828,555
[45] Date of Patent: Oct. 27, 1998

[54] MULTILAYER PRINTED CIRCUIT BOARD AND HIGH-FREQUENCY CIRCUIT DEVICE USING THE SAME

[75] Inventor: Takumi Itoh, Kawasaki, Japan

[73] Assignee: Fujitsu Limited, Kanagawa, Japan

[21] Appl. No.: 859,669

[22] Filed: May 20, 1997

[30] Foreign Application Priority Data

Jul. 25, 1996 [JP] Japan ..................................... 8-196355

[51] Int. Cl.⁶ ..................................................... H05K 1/11
[52] U.S. Cl. .......................... 361/784; 361/748; 361/750; 361/751; 361/753; 361/788; 361/791; 361/792; 361/794; 361/795; 361/736; 333/1; 333/246; 333/202; 333/206; 439/59–66; 439/74; 439/541.5; 439/591; 439/67; 174/259; 174/254; 174/262; 174/266
[58] Field of Search ...................... 361/784, 748, 361/750, 751, 753, 788, 791, 792, 794, 795, 736, 306.3, 818, 321.2, 716; 333/1, 246, 202, 206; 439/59, 60–66, 74, 541.5, 591, 67; 174/259, 254, 262, 266

[56] References Cited

U.S. PATENT DOCUMENTS 5,057,804   10/1991   Sogo et al. ............................. 333/219.1
5,214,571   5/1993   Dahlgren et al. ........................ 361/795
5,680,080   10/1997   Nishiyama et al. ..................... 333/202

FOREIGN PATENT DOCUMENTS 4-267586   9/1992   Japan .

*Primary Examiner*—Leo P. Picard
*Assistant Examiner*—David Foster
*Attorney, Agent, or Firm*—Helfgott & Karas, PC.

[57] ABSTRACT

A multilayer printed-circuit board includes at least one inner-layer signal line, first and second ground layers between which the inner-layer signal line is sandwiched via a frame member made of an insulating material in a thickness direction of the multilayer printed-circuit board, and metallic wall members which are provided on inner walls of slits formed in the frame member and extending along the inner-layer signal line. The first and second ground layers and the metallic wall members shielding the inner-layer signal line.

12 Claims, 14 Drawing Sheets

MULTILAYER PRINTED CIRCUIT BOARD AND HIGH-FREQUENCY CIRCUIT DEVICE USING THE SAME

BACKGROUND OF THE INVENTION

1. Field of the Invention

The present invention generally relates to a multilayer printed-circuit board and a high-frequency circuit device using the same suitable for communication devices or the like. More specifically, the present invention is concerned with a high-frequency circuit device in which a plurality of printed-circuit boards are arranged in a given formation and are connected to a back board.

2. Description of the Related Art

FIG. 1 shows a conventional high-frequency circuit device 10. The high-frequency circuit device 10 has a back board 11 fixed to a rear portion of a shield case (not shown), a coaxial cable 12 provided at the back side of the back board 11, and a plurality of printed-circuit boards 13 and 14 arranged side by side on the back board 11 and are inserted therein.

A DIN-type coaxial connector 15 and a DIN-type coaxial connector 16 are arranged side by side on the back board 11. The coaxial cable 12 has coaxial connectors 17 and 18 provided to the respective ends. The coaxial connector 17 is inserted into the coaxial connector 15 and is electrically connected thereto. The coaxial connector 18 is inserted into the coaxial connector 16 and is electrically connected thereto. In this manner, the coaxial cable 12 is provided at the back surface side of the back board 11.

The printed-circuit boards 13 and 14 respectively have high-frequency circuit parts 13a and 14a, and are respectively equipped with coaxial connectors 13b and 14b. The high-frequency circuit parts 13a and 14a are respectively connected to coaxial connectors 13b and 14b by semi-rigid cables 13c and 14c having a coaxial structure.

The printed-circuit boards 13 and 14 are mounted on the front surface of the back board 11 so that the coaxial connectors 13b and 14b are engaged with the coaxial cables 15 and 16. The high-frequency circuit part 13a of the printed-circuit board 13 is electrically connected to the high-frequency circuit part 14a via the coaxial cable 12.

However, the conventional high-frequency circuit device 10 has the following disadvantage caused by the arrangement in which the high-frequency circuit part 13a of the board 13 and the high-frequency circuit part 14a of the board 14 are connected by the coaxial cable 12. Although FIG. 1 shows only one coaxial cable 10, many coaxial cables are used in practice. This increases the production cost and requires a large space at the back side of the back board 11. Hence, the device 10 has a large size.

SUMMARY OF THE INVENTION

It is a general object of the present invention to provide an improved circuit board and a circuit device using the improved circuit board.

A more specific object of the present invention is to provide a circuit board which makes it possible to avoid use of a coaxial cable used to connect that circuit board to another circuit board and to provide a circuit device for use with such circuit boards.

The above objects of the present invention are achieved by a multilayer printed-circuit board comprising: at least one inner-layer signal line; first and second ground layers between which the inner-layer signal line is sandwiched via a frame member made of an insulating substance in a thickness direction of the multilayer printed-circuit board; and metallic wall members which are provided on inner walls of slits formed in the frame member and extending along the inner-layer signal line. The first and second ground layers and the metallic wall members shield the inner-layer signal line.

The multilayer printed-circuit board may be configured so that: the slits penetrate the multilayer printed-circuit board in the thickness direction thereof; and the metallic wall members include plated films provided on the inner walls of the slits.

The multilayer printed-circuit board may be configured so that: the slits are arranged in lines which respectively extend along the inner-layer signal line; and the slits in each of the lines are spaced apart from each other.

The multilayer printed-circuit board may be configured so that the slits in lines are offset in a direction perpendicular to the direction in which the inner-layer signal line extends.

The multilayer printed-circuit board may further comprise through holes provided further out than ends of the inner-layer signal line, and metallic members respectively provided in the through holes.

The above objects of the present invention are also achieved by a circuit device comprising: printed-circuit boards on which circuit parts are provided; a back board to which the printed-circuit boards are attached and arranged side by side; first connectors provided to the printed-circuit boards; and second connectors provided to the back board and engaged with the first connectors provided to the printed-circuit boards. Each of the printed-circuit boards and the back boards comprise: at least one inner-layer signal line connected to one of the first and second connectors; first and second ground layers between which the inner-layer signal line is sandwiched via a frame member made of an insulating substance in a thickness direction of the multilayer printed-circuit board; and metallic wall members which are provided on inner walls of slits formed in the frame member and extend along the inner-layer signal line. The first and second ground layers and the metallic wall members shield the inner-layer signal line.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
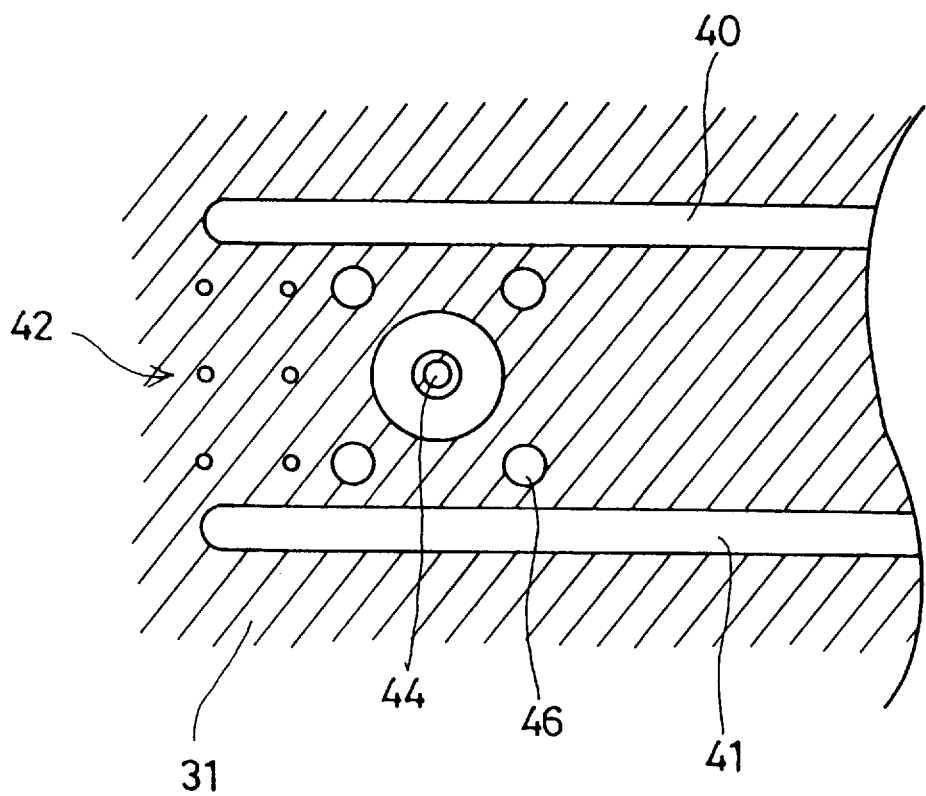
FIG. 3 is an enlarged view of an end portion of an inner-layer signal line of the multilayer printed-circuit board shown in FIG. 2 and a peripheral portion thereof.
Figure 4:
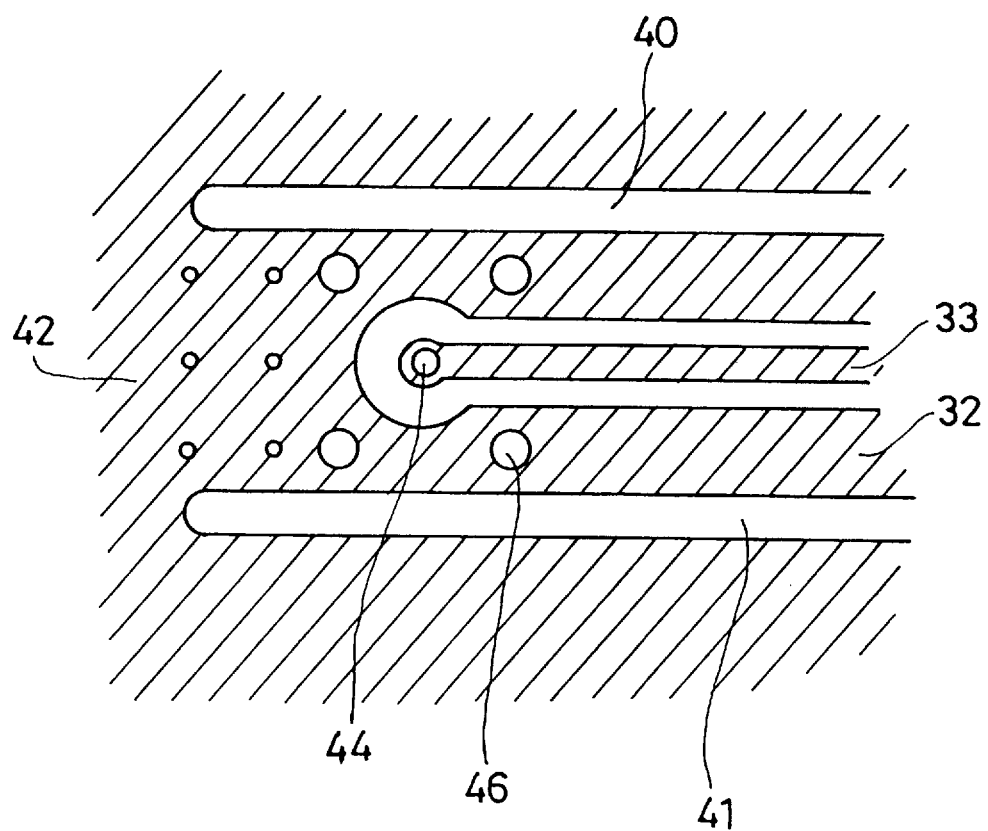
FIG. 4 is a cross-sectional view taken along line III—III shown in FIG. 2.

A description will be given, with reference to FIGS. 2, 3 and 4, of a multilayer printed-circuit board 30 according to a first embodiment of the present invention. The multilayer printed-circuit board 30 includes a ground layer 31, an inner ground layer 32, an inner-layer signal line 33, and a ground layer 34. The ground layer 31 forms the front surface of the printed-circuit board 30, and the ground layer 34 forms the back surface thereof. The inner-layer signal line 33 is provided in the same layer level as the inner ground layer 32.

It can be seen from the above that the multilayer printed-circuit board 30 has a three-layer structure made up of the front ground layer 31, the inner ground layer 32 and the back ground layer 34. When the multilayer printed-circuit board 30 is used, the front ground layer 31, the inner ground layer 32 and the back ground layer 34 are set to the ground potential. The layers 31, 32 and 34 are arranged in stacked formation via a frame member 35 made of an insulating material.

The multilayer printed-circuit board 30 includes slit-shaped through holes 40 and 41, groups 42 and 43 of through holes, through holes 44 and 45, and two through hole sets 46 and 47, each having four through holes. The through holes 44 and 45 are provided to attach the inner conductors of the coaxial connectors to the inner-layer signal line 33. As shown in FIG. 4, the through hole 44 is located at one end portion of the inner-layer signal line 33. The through holes 46 are located around the through hole 44 and are used to attach ground pins of the coaxial connector. Similarly, the through hole 45 is located at one end portion of the inner-layer signal line 33. The through holes 47 are located around the through hole 45 and are used to attach ground pins of the coaxial connector.

The slit-shaped through holes 40 and 41 are made up of slits 50 and 51, and plated films 52 and 53 which are provided by plating the inner wall portions of the frame member 35 defined by the slits 50 and 51 with a metallic member. The plated films 52 and 53 mainly form a metallic plate means. The slits 50 and 51 are provided at both sides of the inner-layer signal line 33 so that the slits 50 and 51 sandwich the inner-layer signal line 33 in the X direction shown in FIG. 2. Further, the slits 50 and 51 penetrate the multilayer printed-circuit board 30 in the Z direction, and extend along the inner-layer signal line 33 in the Y (Y1 or Y2) direction. The plated films 52 and 53 are electrically connected to the front ground layer 31, the back ground layer 34 and the inner ground layer 32. When the multilayer printed-circuit board 30 is used, the plated films 52 and 53 are set to the ground potential. The slit-shaped through holes 40 and 41 are slightly longer than the inner-layer signal line 33, and further extend outwardly from the ends of the inner-layer signal line 33.

The through hole group 42 includes six through holes 54 arranged in a 2×3 matrix formation having a pitch P of, for example, 1.27 mm. Similarly, the through hole group 43 includes six through holes 55 arranged in a 2×3 matrix formation having a pitch P of, for example, 1.27 mm. The group 42 of through holes 54 are provided in an area defined by reference numbers 40a and 41a and are located further out than the through holes 44 and 46 in the Y2 direction. The group 43 of through holes 55 are provided in an area defined by reference numbers 40b and 41b and are located further out than the through holes 55 in the Y1 direction.

The front ground layer 31 and the back ground layer 34 sandwich the whole length of the inner-layer signal line 33 in the Z direction. Further, in the X direction, the inner-layer signal line 33 is sandwiched between the plated film 52 and the inner ground layer 32 and the plated film 53 and the inner ground layer 32. Thus, the inner-layer signal line 33 is totally surrounded by the front ground layer 31, the back ground layer 34, the plated film 52, the plated film 53 and the inner ground layer 32, so that the inner-layer signal line 33 is completely shielded. Hence, the peripheral structure of the inner-layer signal line 33 has the same structure as that of the coaxial cable. More particularly, the inner-layer signal line 33 functions as an inner conductor of the coaxial cable. The frame member 35 made of an insulating substance functions as an insulator provided around the inner conductor of the coaxial cable. The outer conductor of the coaxial cable corresponds to the front ground layer 31, the back ground layer 34, the plated films 52 and 53 and the inner ground layer 32.

The groups 42 and 43 of through holes are located further out than the ends of the inner-layer signal line 33, so that the end portions of the inner-layer signal line 33 can be shielded. Hence, the it is possible to transfer a high-frequency signal over the inner-layer signal line 33 without any leakage.

Figure 5:
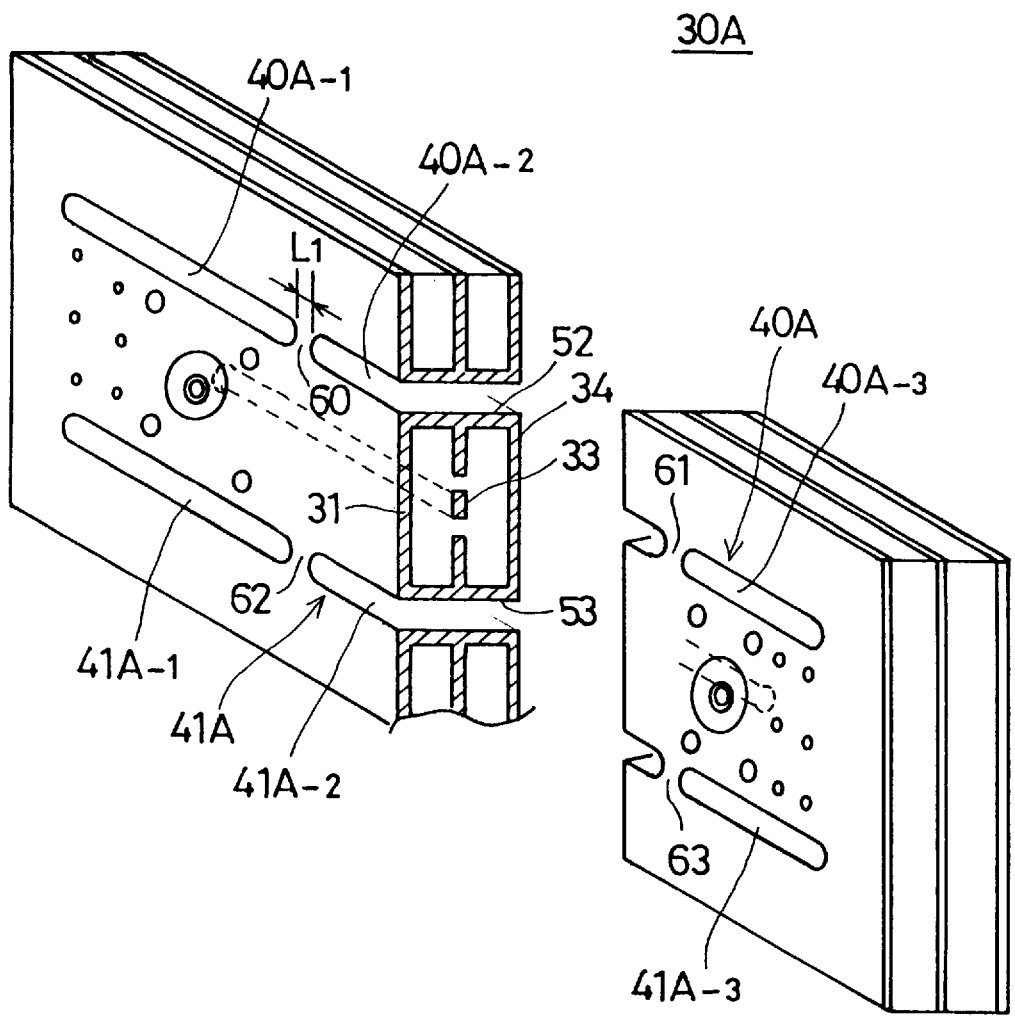
FIG. 5 is a perspective view of a multilayer printed-circuit board according to a second embodiment of the present invention.

FIG. 5 is a perspective view of a multilayer printed circuit board 30A according to a second embodiment of the present invention. The multilayer printed-circuit board 30A has slit-shaped through holes 40A and 41A different from those of the multilayer printed-circuit board 30. The slit-shaped through hole 40A includes three slit-shaped through holes 40A-1, 40A-2 and 40A-3, which are arranged in line via short joint portions 60 and 61. Similarly, the slit-shaped through hole 41A includes three slit-shaped through holes 41A-1, 41A-2 and 41A-3, which are arranged in line via short joint portions 62 and 63. The shot joint portions 60 through 63 have a length L which is sufficiently short to prevent electromagnetic waves from being leaked.

The short joint portions 60 through 63 functions to enhance the mechanical strength of the multilayer printed-circuit board 30A.

Figure 6:
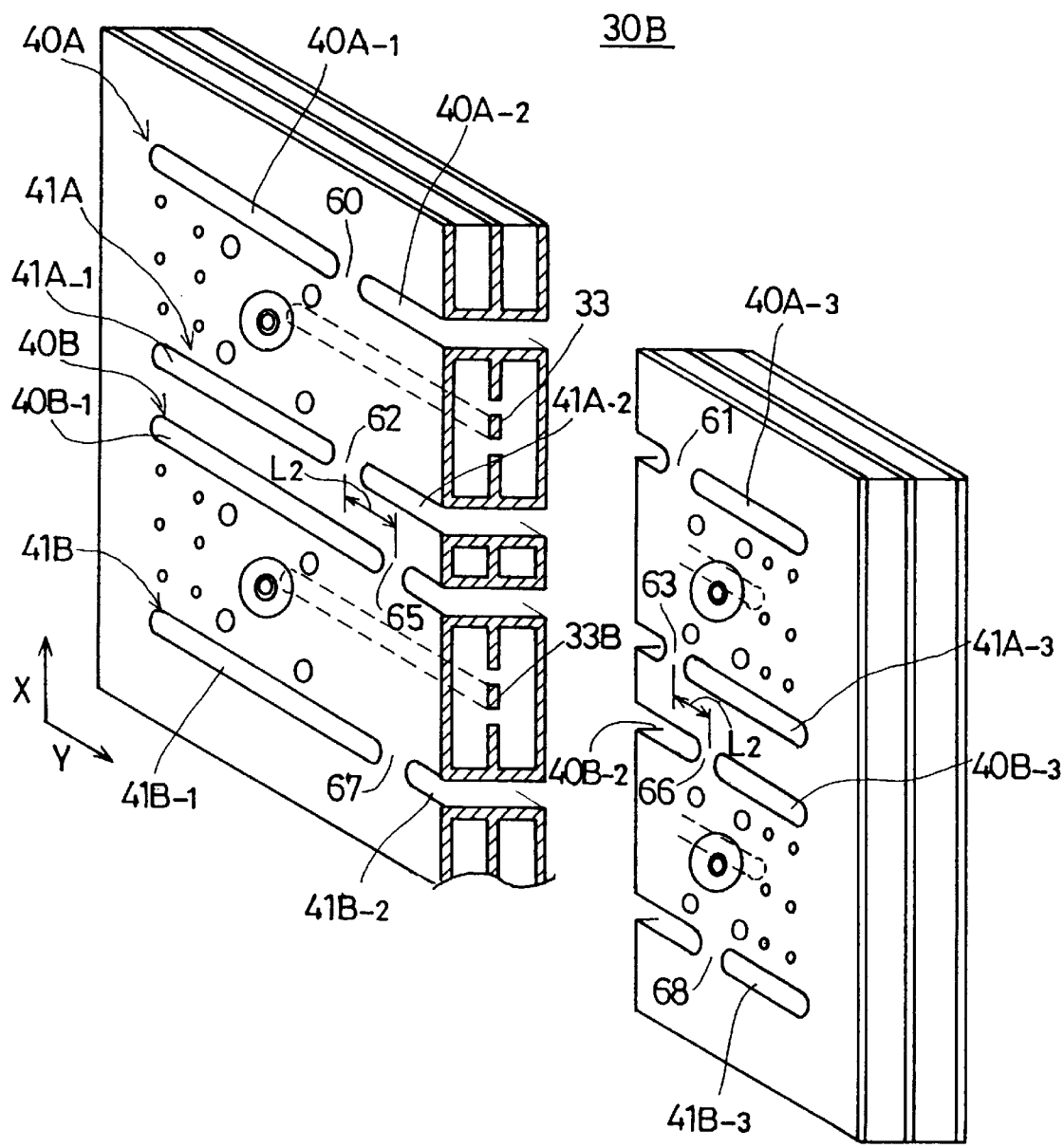
FIG. 6 is a perspective view of a multilayer printed-circuit board according to a third embodiment of the present invention.

FIG. 6 is a perspective view of a multilayer printed-circuit board 30B according to a third embodiment of the present invention. The multilayer printed-circuit board 30B has another inner-layer signal line 33B, which extends in parallel to the inner-layer signal line 33. With respect to the inner-layer signal line 33, the slit-shaped through holes 40A-1, 40A-2, 40A-3, 41A-1, 41A-2 and 41A-3 are provided via the short joint portions 60 through 63.

Similarly, slit-shaped through holes 40B and 41B are provided to the inner-layer signal line 33B. The slit-shaped through hole 40B includes three slit-shaped through holes 40B-1, 40B-2 and 40B-3, which are arranged in line via short joint portions 65 and 66. The slit-shaped through hole 41B includes three slit-shaped through holes 41B-1, 41B-2 and 41B-3, which are arranged in line via short joint portions 67 and 68.

As shown in FIG. 6, the short joint portion 62 for the slit-shaped through hole 40B and the short joint portion 65 for the slit-shaped through hole 41B are offset by a length L2 along the inner-layer signal line 33 extending in the Y direction. The length L2 is relatively long so that the joint portions 62, 65 and 66 face the slit-shaped through holes 40B-1, 41A-1 and 41A-3, respectively.

Hence, even if an electromagnetic wave generated from the inner-layer signal line 33 is leaked via the joint portions 62 and 63, the wave is interrupted by the slit-shaped through holes 40B-1 and 40B-2, and is not transferred to the inner-layer signal line 33B over the slit-shaped through hole 40B. Even if electromagnetic wave generated from the inner-layer signal line 33B is leaked via the joint portions 65 and 66, the wave is interrupted by the slit-shaped through holes 41A-2 and 41A-3, and is not transferred to the inner-layer signal line 33 over the slit-shaped through hole 41A. Hence, it is possible to prevent the high-frequency signal transferred on the inner-layer signal line 33 and the high-frequency signal transferred on the inner-layer signal line 33B from being interfered.

Figure 7:
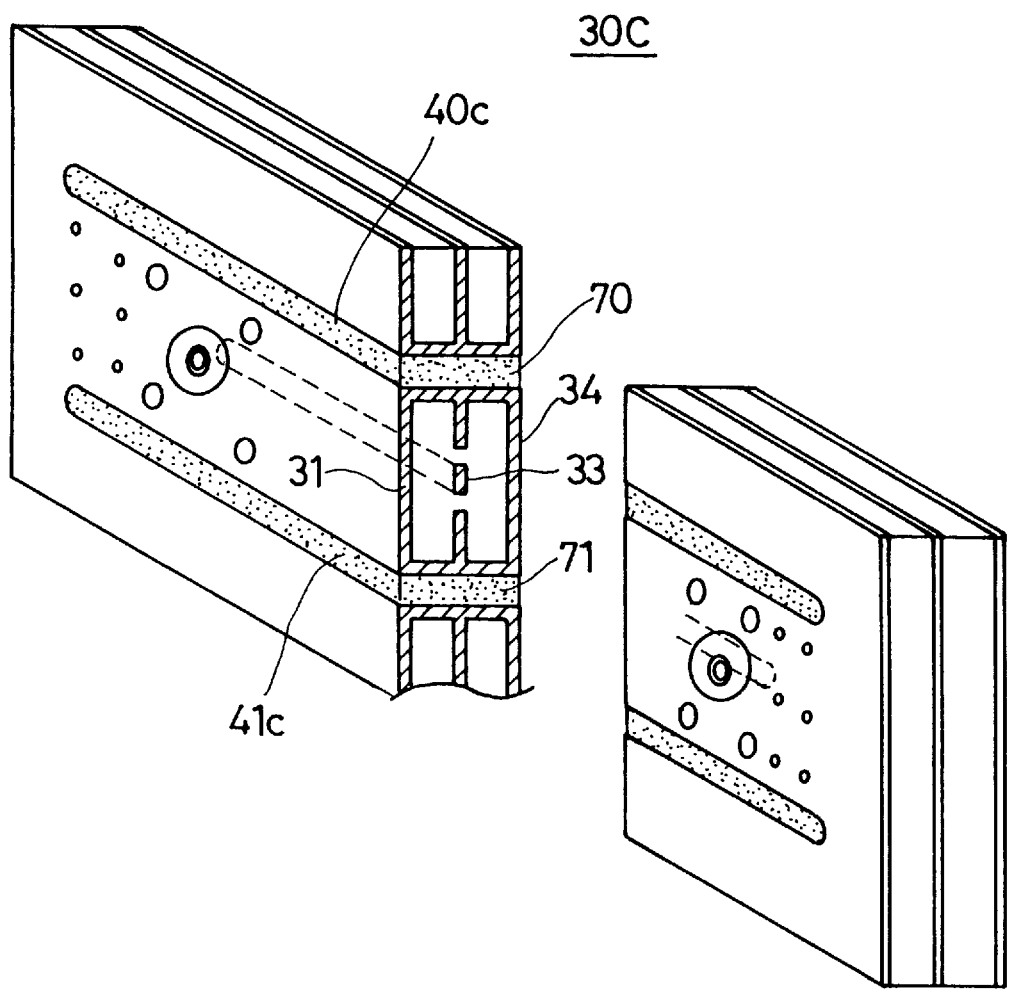
FIG. 7 is a perspective view of a multilayer printed-circuit board according to a fourth embodiment of the present invention.

FIG. 7 is a perspective view of a multilayer printed-circuit board 30C according to a fourth embodiment of the present invention. The multilayer printed-circuit board 30C has slit-shaped through holes 40C and 41C different from those of the multilayer printed-circuit board 30. The slit-shaped through holes 40C and 41C are filled with solder 70 and 71, respectively. The slit-shaped through holes 40C and 41C filled with the solders 70 and 71 functions as metallic wall means. More particularly, the solder 70 and 71 not only functions as shield walls but also reinforces the mechanical strength of the multilayer printed-circuit board 30C. It should be noted that the multilayer printed-circuit board 30C has a mechanical strength as strong as that of a multilayer printed circuit board having no slit-shaped through holes.

Figure 8:
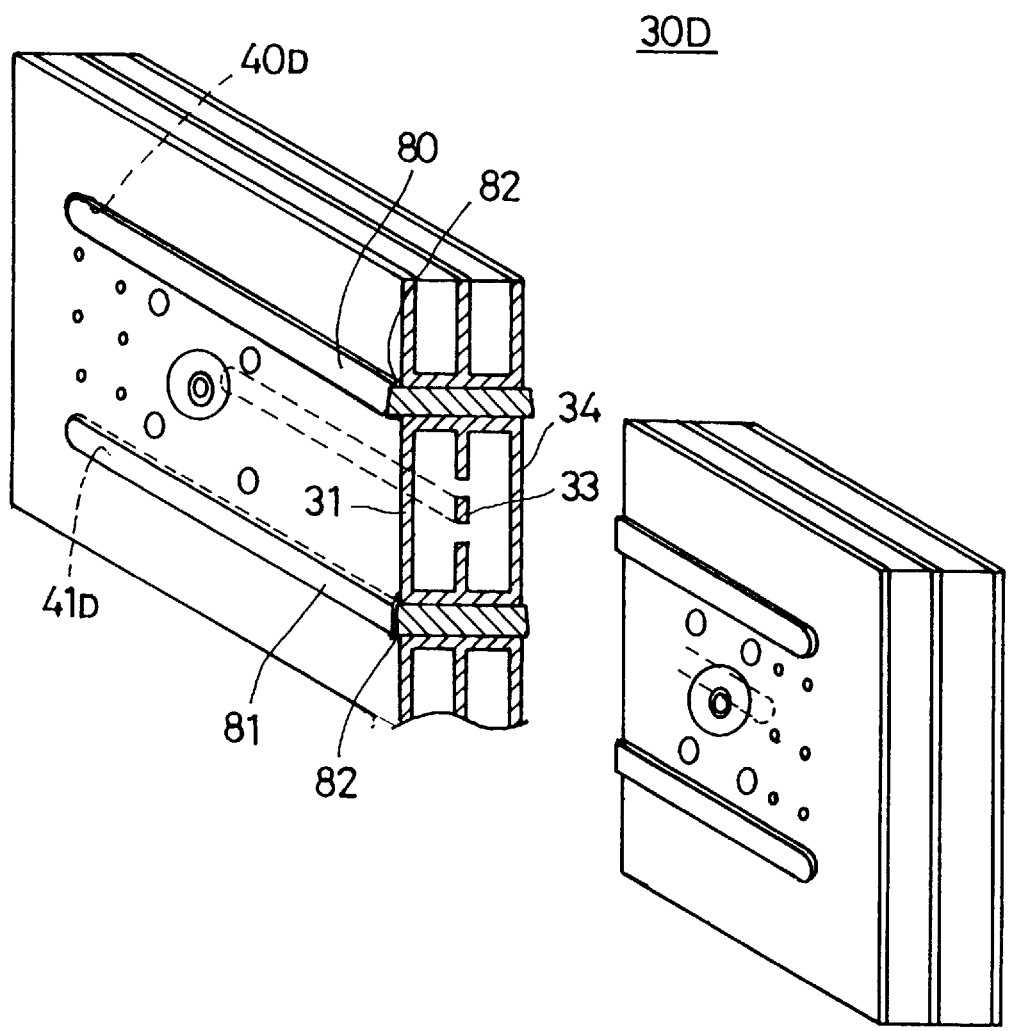
FIG. 8 is a perspective view of a multilayer printed-circuit board according to a fifth embodiment of the present invention.

FIG. 8 is a perspective view of a multilayer printed-circuit board 30D according to a fourth embodiment of the present invention. The multilayer printed-circuit board 30D has slit-shaped through holes 40D and 41D, which are different from those of the multilayer printed-circuit board 30. As shown in FIG. 8, metallic strip members 80 and 81 are respectively inserted into the slit-shaped through holes 40D and 41D, and are soldered by solder 82. The metallic strip members 80 and 81 respectively provided in the slit-shaped through holes 40D and 41D function as metallic wall means.

The metallic strip members 80 and 81 fixed by the solder 82 function as shield walls and further reinforce the portions about the slit-shaped through holes 40D and 41D, so that the mechanical strength of the multilayer printed-circuit board 30D can be enhanced. It should be noted that the multilayer printed-circuit board 30D has a mechanical strength as strong as that of a multilayer printed circuit board having no slit-shaped through holes.

A description will now be given of a high-frequency circuit device utilizing the multilayer printed-circuit board 30 shown in FIG. 2.

Figure 2:
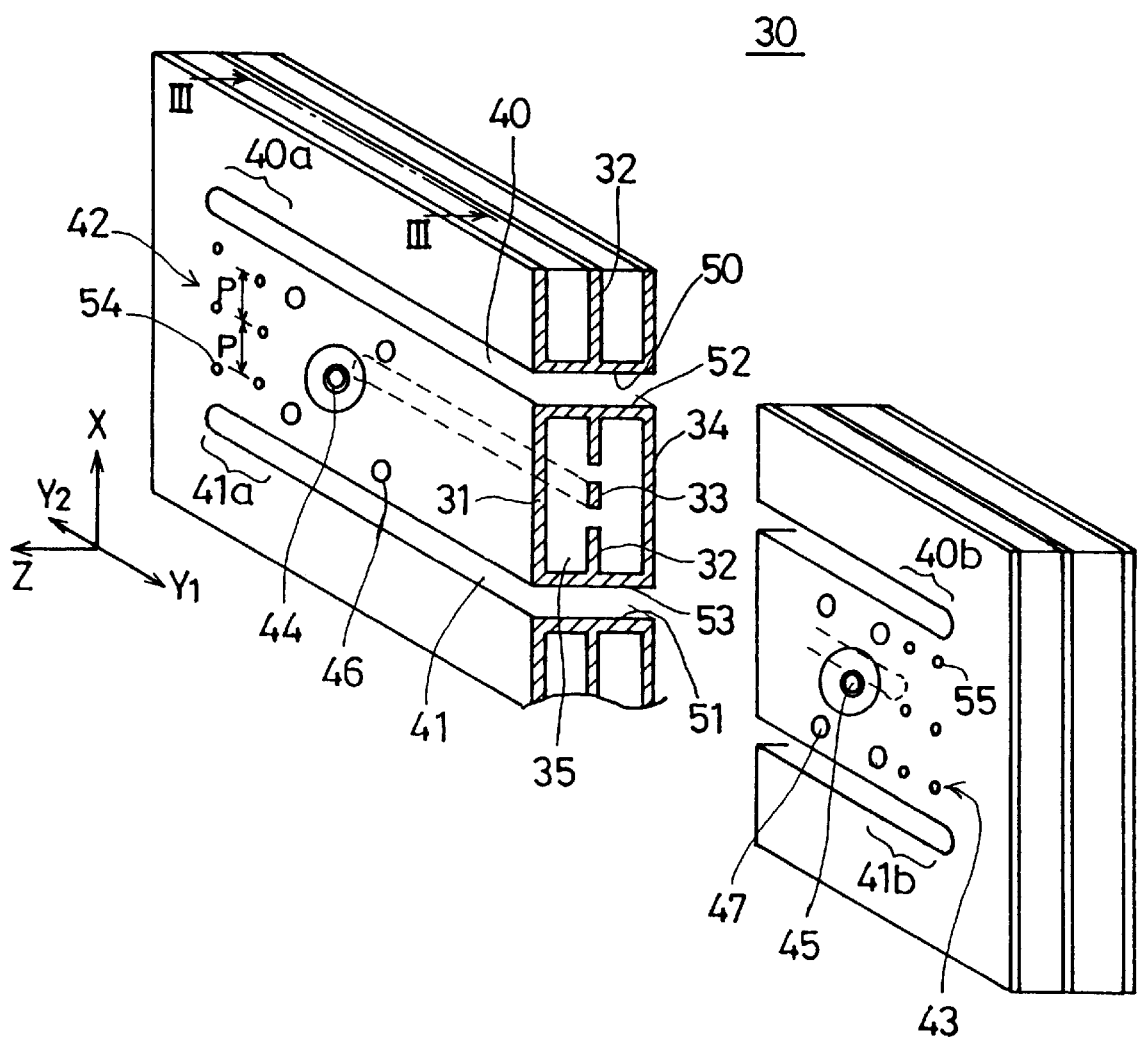
FIG. 2 is a perspective view of a multilayer printed-circuit board according to a first embodiment of the present invention.
Figure 9:
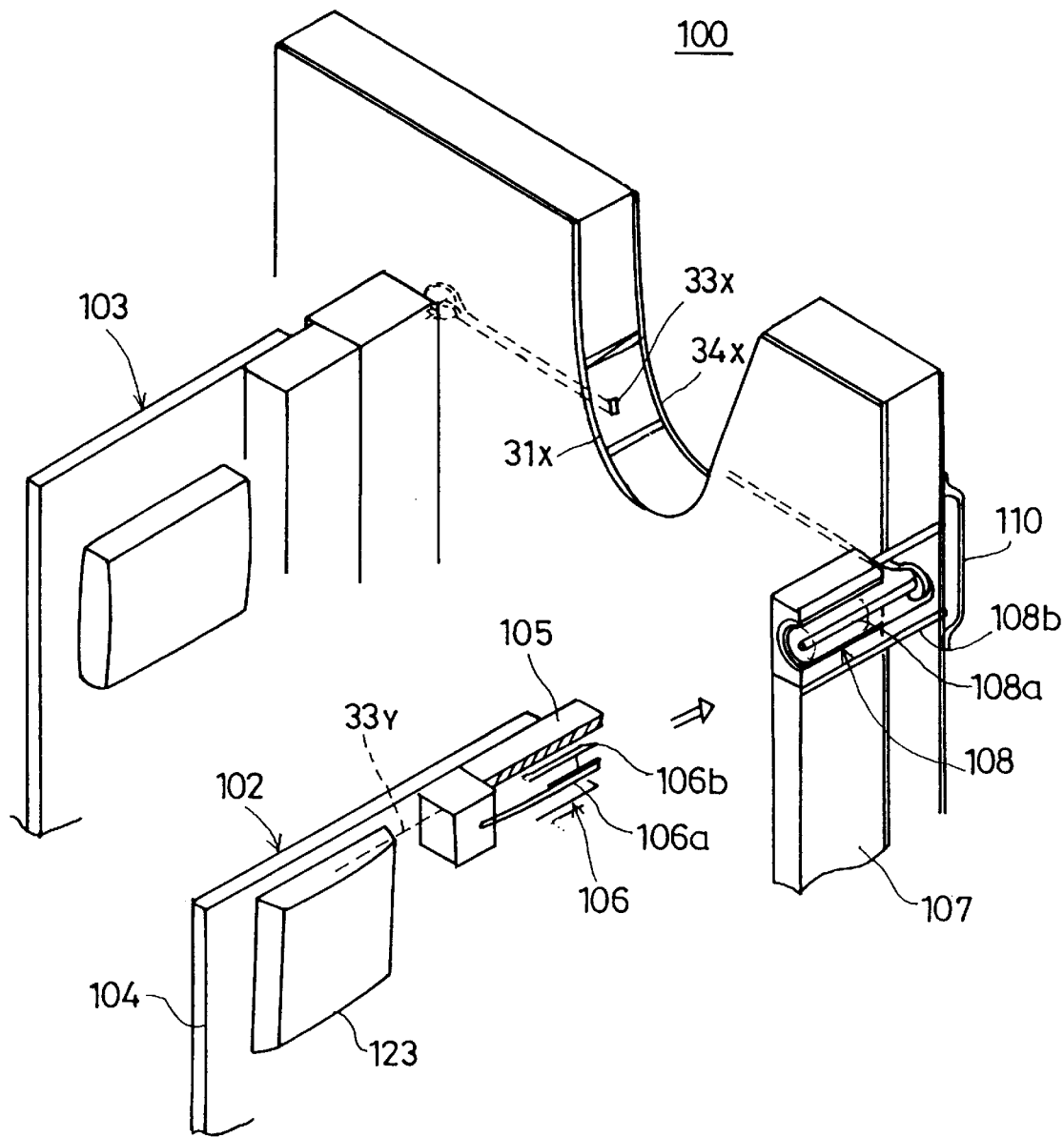
FIG. 9 is a perspective view of a high-frequency circuit device utilizing the multilayer printed-circuit board shown in FIG. 2.
Figure 10:
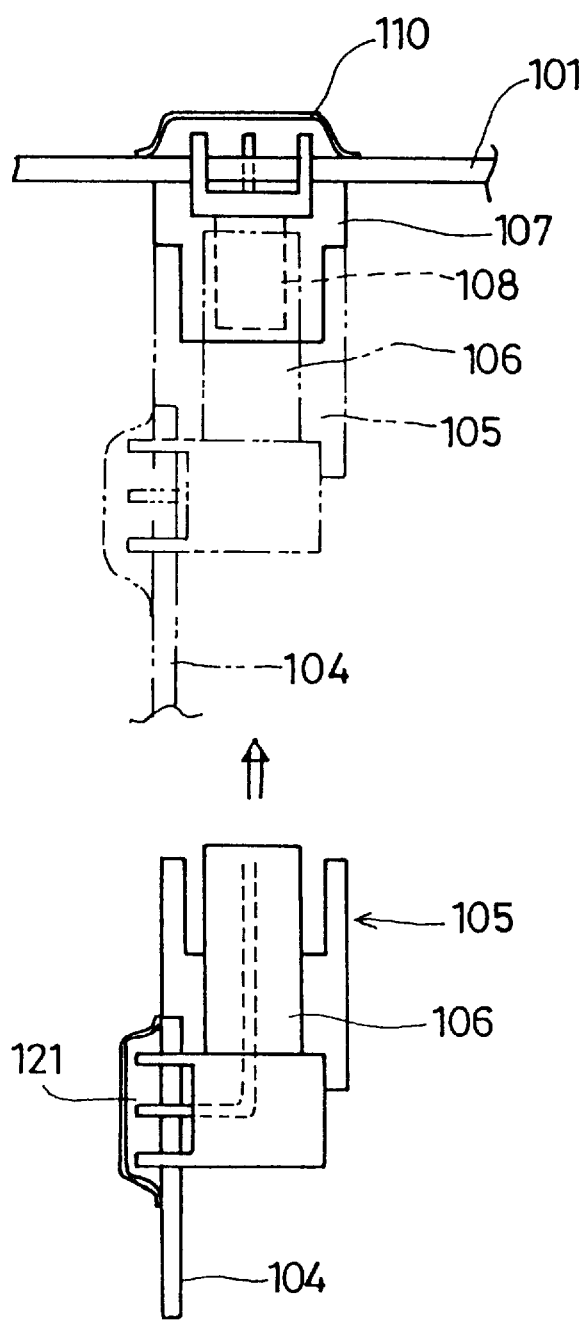
FIG. 10 is a diagram showing a connection between the printed-circuit board and a back board.

FIGS. 9 and 10 show a high-frequency circuit device 100 utilizing the multilayer printed-circuit board 30 shown in FIG. 2. The high-frequency circuit device 100 is part of a communication device, and is made up of a back board 101 fixed to a rear portion of a shield case (not shown), and a plurality of printed circuit boards 102 and 103 arranged on the back board 101 and located within the shield case.

The printed-circuit board 102 is electrically connected to the back board 101 by connecting a male coaxial connector 106 within a DIN connector 105 fixed to an end of a printed-circuit board 104 to a female coaxial connector 108 within a DIN connector 107 mounted on the back board 101. The other printed-circuit board 103 is connected to the back board 101 in the same manner as described above.

Figure 11:
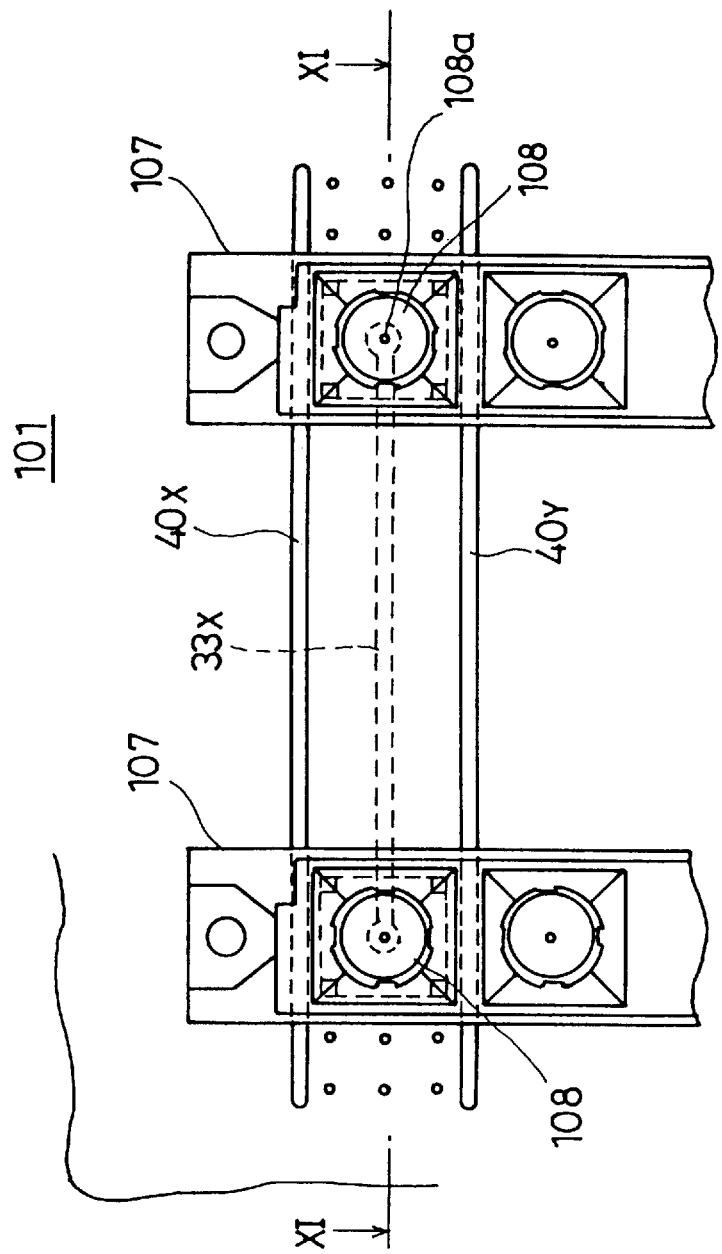
FIG. 11 is an enlarged view of a part of the back board.
Figure 12:
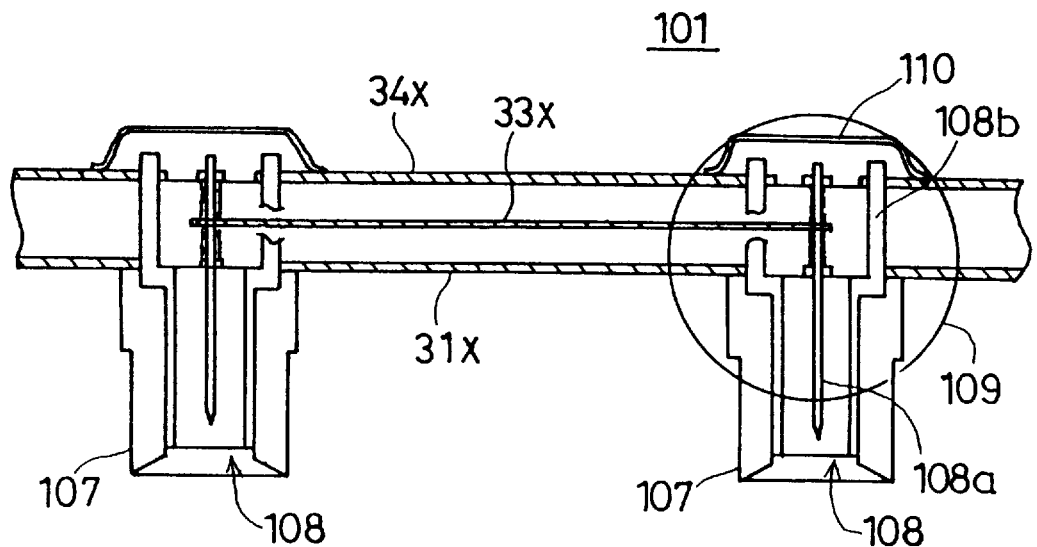
FIG. 12 is a cross-sectional view taken along line XI—XI shown in FIG. 11.
Figure 13:
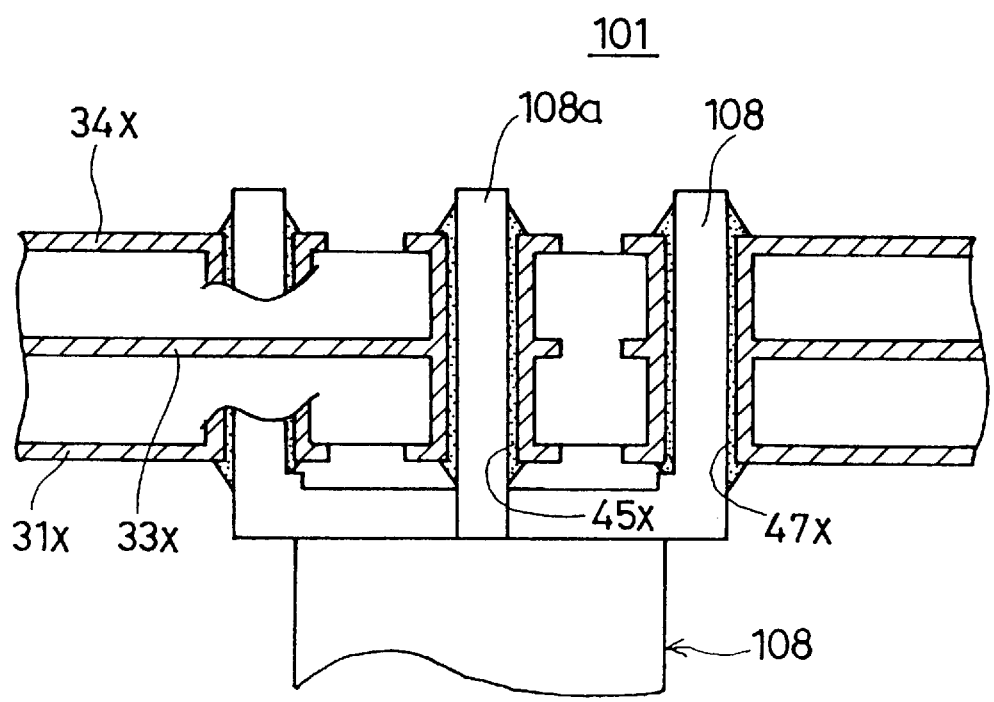
FIG. 13 is an enlarged view of part 109 shown in FIG. 12.

FIGS. 11, 12 and 13 show the back board 101. A plurality of DIN connectors 107 are arranged on the back board 101 side by side. The back board 101 has an inner-layer signal line, which is the same as that of the multilayer printed-circuit board 30 shown in FIG. 2. Parts of the back board 101 that are the same as those of the multilayer printed-circuit board 101 are given the same reference numbers with a suffix X. An inner-layer signal line 33 has a coaxial cable structure so that it is surrounded by slit-shaped through holes 40X, 41X, a front ground layer 31X and a back ground layer 34X.

Figure 1:
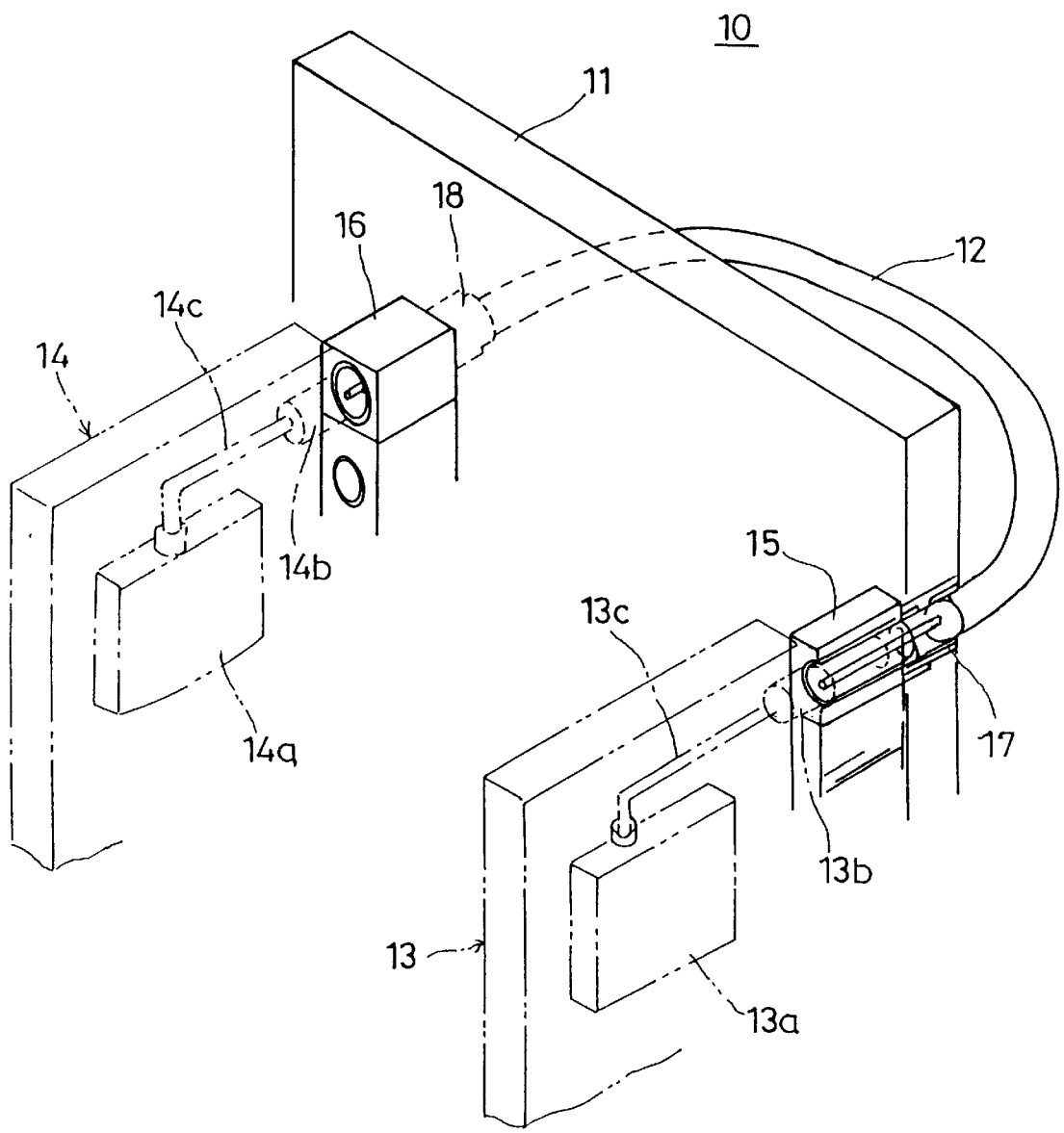
FIG. 1 is a perspective view of a conventional high-frequency circuit device.

The two female coaxial connectors 108 have respective inner conductors 108a, which are inserted into through holes 45X. Ground pins 108b are inserted into through holes 47X and are soldered. The inner conductors 108a are connected to ends of the inner-layer signal line 33X. Hence, the inner conductors 108a of the two female coaxial connectors 108 are electrically connected together by the inner-layer signal line 33X having the coaxial cable structure. Hence, the high-frequency circuit device shown in FIGS. 11, 12 and 13 does not need the coaxial cable 12 shown in FIG. 1.

Metallic caps 110 are attached to the back surface of the back board 101, and cover the ends of the inner conductors 108a and the ends of the ground pins 108b, so that shielding can be established.

Figure 14:
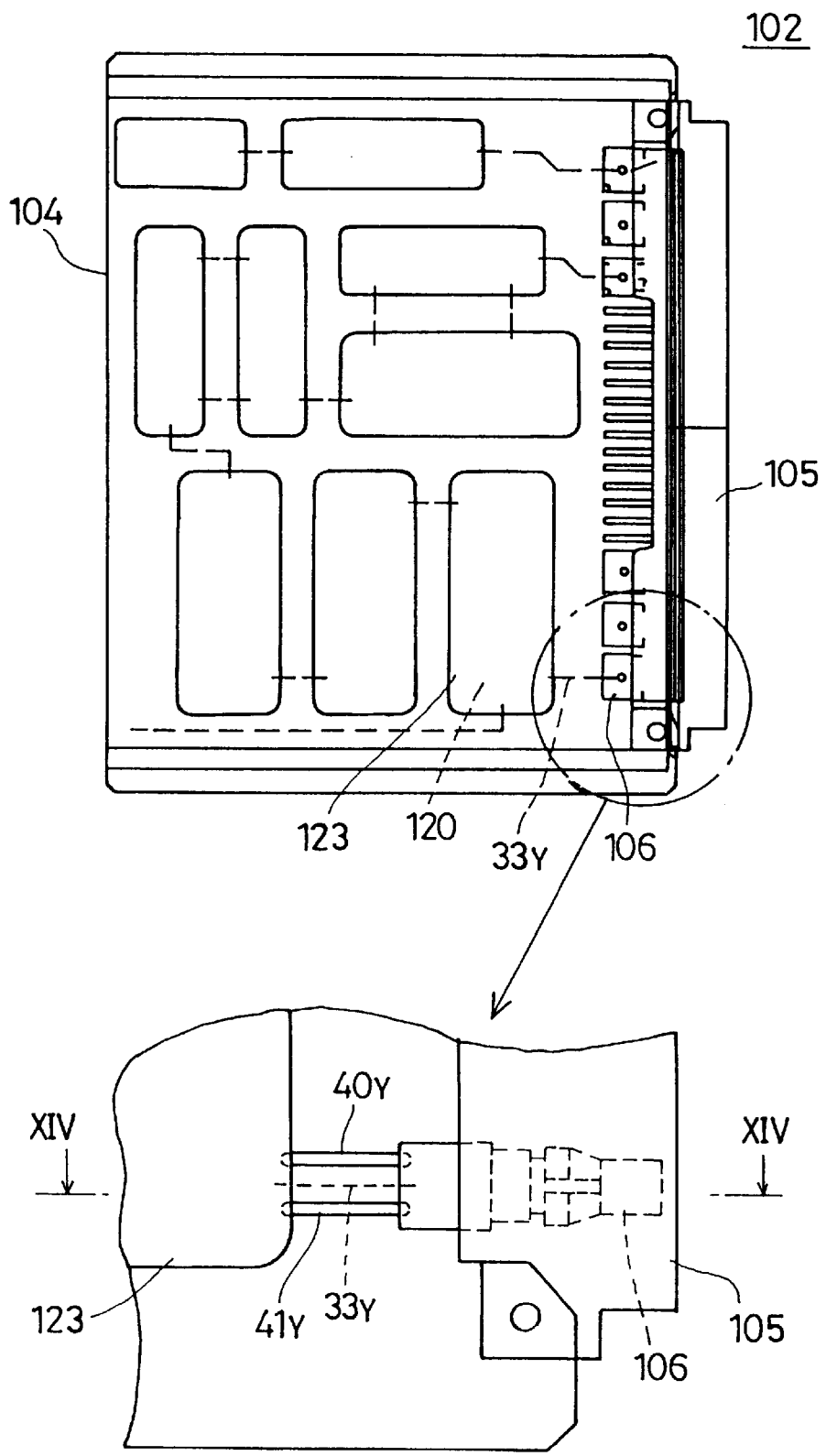
FIG. 14 is a plan view of a multilayer printed-circuit board on which high-frequency circuit parts are provided.
Figure 15:
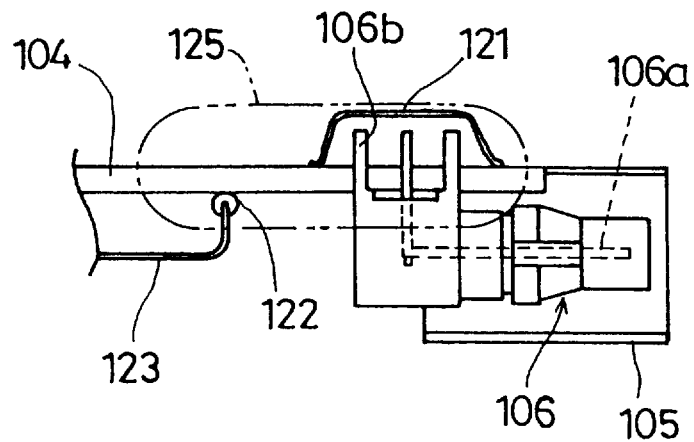
FIG. 15 is a cross-sectional view taken along line XIV—XIV shown in FIG. 14.
Figure 16:
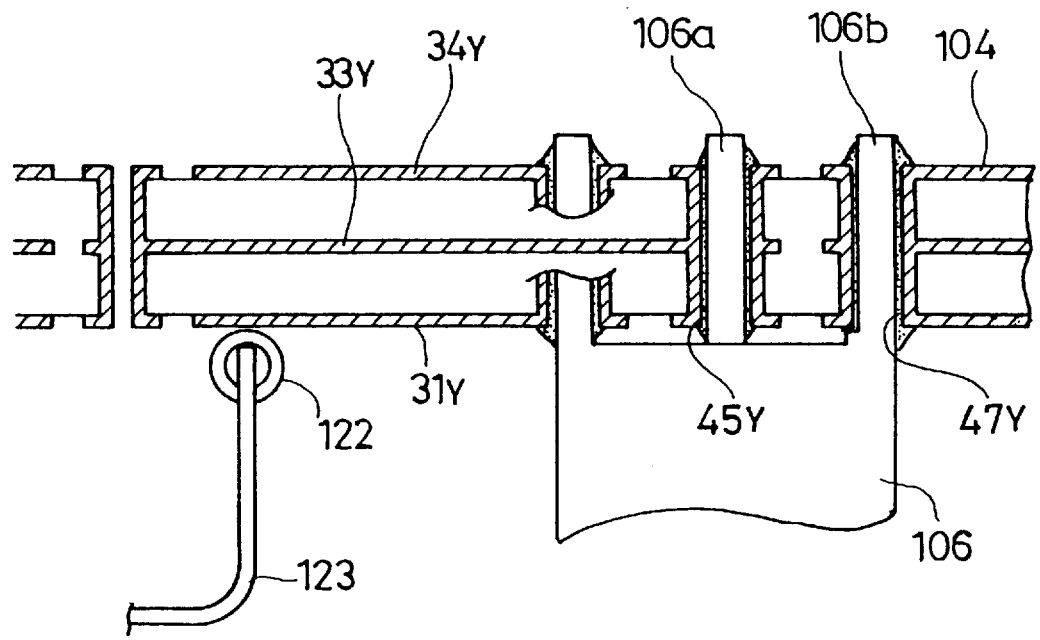
FIG. 16 is an enlarged view of part 125 shown in FIG. 15.

FIGS. 14, 15 and 16 show the printed-circuit board 102. As shown in FIG. 14, the printed-circuit board 102 includes a printed-circuit board portion 104 and the DIN connector 105 fixed to an end of the printed-circuit board portion 104. The printed-circuit board portion 104 has an inner-layer signal line which has the same structure as that of the multilayer printed-circuit board 30 shown in FIG. 2. Parts of the printed-circuit board portion 104 that are the same as those of the multilayer printed-circuit board 30 are given the same reference numbers with a suffix Y.

An inner-layer signal line 33Y has a coaxial cable structure so that it is surrounded by slit-shaped through holes 40Y, 41Y, a front ground layer 31Y and a back ground layer 34Y.

The male coaxial connectors 106 have inner conductors 106a, which are inserted into through holes 45Y (FIG. 16) and are soldered. The male coaxial connectors 106 have ground pins 106b, which are inserted into through holes 47Y (FIG. 16) and are soldered. The inner conductors 106a are connected to one end of the inner-layer signal line 33Y, the other end of which line is connected to a high-frequency circuit part 120 (FIG. 14) provided on the printed-circuit board portion 104. Hence, the high-frequency circuit parts 120 and the male coaxial connectors 106 of the DIN connector 105 are electrically connected together by the inner-layer signal lines 33Y having the coaxial cable structure. Hence, the high-frequency circuit device shown in FIGS. 14 through 16 does not need the semi-rigid cables 13c and 14c shown in FIG. 1.

As shown in FIGS. 14 through 16, metallic caps 121 are attached to the back surface of the printed-circuit board portion 104, and cover the inner conductors 106a and the ground pins 106b of the male coaxial connectors 106. The high-frequency circuit parts 120 mounted on the printed-circuit board portions 104 are covered by cap-shaped shield cases 123 having electrically conductive shield rubber members 122 provided around the cases 123, and are thus shielded thereby.

The present invention is not limited to the specifically disclosed embodiments, and variations and modifications may be made without departing from the scope of the present invention.

What is claimed is:

1. A multilayer printed-circuit board comprising:

at least one inner-layer signal line;

first and second ground layers between which said at least one inner-layer signal line is sandwiched via a frame member made of an insulating material in a thickness direction of the multilayer printed-circuit board; and metallic wall members provided on inner walls of slits formed in the frame member and extending along said at least one inner-layer signal line, said first and second ground layers and said metallic wall members shielding said at least one inner-layer signal line.

2. The multilayer printed-circuit board as claimed in claim 1, wherein:

said slits penetrate the multilayer printed-circuit board in the thickness direction thereof; and said metallic wall members include plated films provided on the inner walls of the slits.

3. The multilayer printed-circuit board as claimed in claim 1, wherein:

said slits penetrate the multilayer printed-circuit board in the thickness direction thereof; and said metallic wall members include solders filled in said slits.

4. The multilayer printed-circuit board as claimed in claim 1, wherein:

said slits penetrate the multilayer printed-circuit board in the thickness direction thereof; and said metallic wall members include metallic strip members provided in said slits and soldered therein.

5. The multilayer printed-circuit board as claimed in claim 2, wherein:

said slits are arranged in lines which respectively extend along said at least one inner-layer signal line; and said slits in each of the lines are spaced apart from each other.

6. The multilayer printed-circuit board as claimed in claim 3, wherein:

said slits are arranged in lines which respectively extend along said at least one inner-layer signal line; and said slits in each of the lines are spaced apart from each other.

7. The multilayer printed-circuit board as claimed in claim 4, wherein:

said slits are arranged in lines which respectively extend along said at least one inner-layer signal line; and said slits in each of the lines are spaced apart from each other.

8. The multilayer printed-circuit board as claimed in claim 5, wherein said slits in lines are offset in a direction perpendicular to the direction in which said at least one inner-layer signal line extends.

9. The multilayer printed-circuit board as claimed in claim 6, wherein said slits in lines are offset in a direction perpendicular to the direction in which said at least one inner-layer signal line extends.

10. The multilayer printed-circuit board as claimed in claim 7, wherein said slits in lines are offset in a direction perpendicular to the direction in which said at least one inner-layer signal line extends.

11. The multilayer printed-circuit board as claimed in claim 1, further comprising through holes provided further out than ends of said at least one inner-layer signal line, and metallic members respectively provided in the through holes.

12. A circuit device comprising:

printed-circuit boards on which circuit parts are provided;

a back board to which the printed-circuit boards are attached and arranged side by side;

first connectors provided to the printed-circuit boards; and second connectors provided to the back board and engaged with the first connectors provided to the printed-circuit boards, each of the printed-circuit boards and the back boards comprising:

at least one inner-layer signal line connected to one of the first and second connectors;

first and second ground layers between which said at least one inner-layer signal line is sandwiched via a frame member made of an insulating material in a thickness direction of the multilayer printed-circuit board; and metallic wall members provided on inner walls of slits formed in the frame member and extending along said at least one inner-layer signal line, said first and second ground layers and said metallic wall members shielding said at least one inner-layer signal line.

* * * * *